United States Patent
Ho et al.

(10) Patent No.: US 6,281,041 B1
(45) Date of Patent: Aug. 28, 2001

(54) PROCESS TO MAKE A TALL SOLDER BALL BY PLACING A EUTECTIC SOLDER BALL ON TOP OF A HIGH LEAD SOLDER BALL

(75) Inventors: Chung W Ho, Monte Sereno; Tsing-Chow Wang, Cupertino, both of CA (US)

(73) Assignee: Aptos Corporation, Milpitas, CA (US)

(*) Notice: Subject to any disclaimer, the term of this patent is extended or adjusted under 35 U.S.C. 154(b) by 0 days.

(21) Appl. No.: 09/450,545

(22) Filed: Nov. 30, 1999

(51) Int. Cl.[7] .......................... H01L 21/44; H01L 21/48; H01L 21/50
(52) U.S. Cl. ............................. 438/106; 438/612
(58) Field of Search .................. 438/51, 54, 64, 438/104, 106, 118, 612, 613, 687, 720, 722

(56) References Cited

U.S. PATENT DOCUMENTS

| | | |
|---|---|---|
| 4,783,722 | * 11/1988 | Osaki et al. .................. 361/411 |
| 5,130,779 | 7/1992 | Agarwala et al. . |
| 5,225,634 | 7/1993 | Petroz . |
| 5,640,052 | 6/1997 | Tsukamoto . |
| 5,854,514 | 12/1998 | Roldan et al. . |

OTHER PUBLICATIONS

"Super CSP: The Wafer Level Package", Semiconductor Packaging Symposium, Session V: Chipscale Packaging, SEMI (1988), pp. F–1–F–10.

* cited by examiner

Primary Examiner—David Nelms
Assistant Examiner—David Nhu
(74) Attorney, Agent, or Firm—Tung & Associates

(57) ABSTRACT

Within a method for forming a solder interconnection structure for use within a microelectronic fabrication, there is first provided a substrate having formed thereover a bond pad. There is then formed upon the bond pad a first solder interconnection layer. There is then formed over the first solder interconnection layer an annular solder non-wettable copper oxide layer which does not cover an upper dome portion of the first solder interconnection layer. There is then formed over the upper dome portion of the first solder interconnection layer and not upon the annular solder non-wettable copper oxide layer a second solder interconnection layer.

12 Claims, 2 Drawing Sheets

PROCESS TO MAKE A TALL SOLDER BALL BY PLACING A EUTECTIC SOLDER BALL ON TOP OF A HIGH LEAD SOLDER BALL

BACKGROUND OF THE INVENTION

1. Field of the Invention

The present invention relates generally to methods for forming solder interconnection structures for directly interconnecting microelectronic substrates within microelectronic fabrications. More particularly, the present invention relates to methods for forming, with attenuated physical stress and strain, solder interconnection structures for directly interconnecting microelectronic substrates within microelectronic fabrications.

2. Description of the Related Art

Microelectronic fabrications are formed from microelectronic substrates over which are formed patterned microelectronic conductor layers which are separated by microelectronic dielectric layers.

As a method for directly interconnecting microelectronic substrates of various varieties, it is common in the art of microelectronic fabrication to employ a solder interconnection method which employs a solder interconnection structure positioned interposed between a pair of opposing bond pads fabricated within a corresponding pair of microelectronic substrates desired to be directly interconnected, where upon thermal annealing and reflow of the solder interconnection structure positioned interposed between the pair of opposing bond pads there is formed a reflowed solder interconnection structure formed interposed between the pair of opposing bond pads, which reflowed solder interconnection structure electrically and mechanically directly interconnects the pair of microelectronic substrates. Commonly, although not exclusively, within the solder interconnection method: (1) the solder interconnection structure is formed as a truncated spherical shape formed flattened upon one of the bond pads formed upon one of the microelectronic substrates; and (2) the reflowed solder interconnection structure is formed as a barrel shape bridging between the pair of bond pads formed within the corresponding pair of microelectronic substrates.

While such solder interconnection methods and solder interconnection structures are quite common in the art of microelectronic fabrication, such solder interconnection methods and solder interconnection structures are nonetheless not entirely without problems in the art of microelectronic fabrication.

In particular, as microelectronic fabrication integration levels have increased and microelectronic fabrication functionality has also increased, so too has the absolute density and the areal density of solder interconnection structures employed within advanced microelectronic fabrications for directly interconnecting advanced microelectronic substrates within advanced microelectronic fabrications. While such increased absolute density and such increased areal density of solder interconnection structures is essential for providing advanced microelectronic fabrications with enhanced functionality, such increased absolute density of solder interconnection structures, and in particular such increased areal density of solder interconnection structures, is nonetheless problematic insofar as increased areal density of a conventional solder interconnection structure typically limits the height of the conventional solder interconnection structure since the conventional solder interconnection structure is, as noted above, typically formed with a truncated spherical shape formed upon a bond pad. Similarly, solder interconnection structures formed of limited height when employed within microelectronic fabrication for directly interconnecting microelectronic substrates within microelectronic fabrications are undesirable insofar as corresponding reflowed solder interconnection structures of limited height are generally insufficient to adequately deflect and dissipate thermally induced physical stress and strain encountered incident to fabrication and/or operation of a microelectronic fabrication comprised of a pair of reflowed solder interconnection structure interconnected microelectronic substrates.

It is thus desirable within the art of microelectronic fabrication to fabricate solder interconnection structures for use when directly interconnecting microelectronic substrates employed within microelectronic fabrications in a fashion such as to attenuate thermally induced physical stress and strain within corresponding thermally reflowed solder interconnection structures with respect to microelectronic substrates which are directly interconnected with those thermally reflowed solder interconnection structures.

It is similarly towards the foregoing object that the present invention is directed.

Various methods and materials have been disclosed within the art of microelectronic fabrication for forming, with desirable properties, interconnection structures for directly interconnecting microelectronic substrates within microelectronic fabrications.

For example, Michelle M. Hou, in "Super CSP: The Wafer Level Package," Semiconductor Packaging Symposium, Session V: Chipscale Packaging, SEMI (1998), pp. F-1 to F-10, discloses a cost effective solder interconnection method and a resulting solder interconnection structure interconnected microelectronic fabrication comprising a semiconductor substrate directly interconnected with an additional microelectronic substrate. The solder interconnection method employs forming a series of solder interconnection layers upon a corresponding series of bond pads formed over multiple integrated circuit die within a single semiconductor substrate, wherein the single semiconductor substrate is encapsulated with a resin prior to parting the semiconductor substrate to form the integrated circuit die having formed thereover the solder interconnection layers formed upon the bond pads.

In addition, Agarwala et al., in U.S. Pat. No. 5,130,779, disclose: (1) a solder interconnection structure with an enhanced aspect ratio for use within a microelectronic fabrication for directly interconnecting, with attenuated physical stress and strain, a pair of microelectronic substrates within the microelectronic fabrication; and (2) a method for forming the solder interconnection structure with the enhanced aspect ratio for use within the microelectronic fabrication for directly interconnecting, with attenuated physical stress and strain, the pair of microelectronic substrates within the microelectronic fabrication. The solder interconnection method employs forming upon at least one solder interconnection layer employed within the solder interconnection structure, prior to thermal reflow of the solder interconnection layer: (1) a capping or encapsulant metal layer, or in the alternative; (2) a sidewall spacer layer, such that upon thermal reflow of the at least one solder interconnection layer the at least one solder interconnection layer is not susceptible to thermal reflow induced collapse.

Further, Petroz, in U.S. Pat. No. 5,225,634, discloses a hybrid circuit microelectronic fabrication comprising a pair of microelectronic substrates directly interconnected with a series electrical interconnection layers, wherein the hybrid circuit microelectronic fabrication is fabricated absent thermally induced physical stress or strain of the pair of microelectronic substrates with respect to the series of electrical interconnection layers. The hybrid circuit microelectronic fabrication realizes the foregoing object by employing when fabricating the hybrid circuit microelectronic fabrication: (1) electrical interconnection layers which are formed as spheres which are non-adherent to pairs of counter opposed bond pads upon which they are landed within the corresponding pair of microelectronic substrates within the hybrid circuit microelectronic fabrication; and (2) bond pads which are formed as tracks upon which the spherical electrical interconnection layers may freely rotate.

Finally, Tsukamoto, in U.S. Pat. No. 5,640,052, discloses a solder interconnection structure for use when directly interconnecting a pair of microelectronic substrates within a microelectronic fabrication, where the solder interconnection structure provides for attenuated thermally induced physical stress and strain of the pair of microelectronic substrate with respect to the solder interconnection structure when directly interconnecting the pair of microelectronic substrates within the microelectronic fabrication while employing the solder interconnection structure. To realize the foregoing object, the solder interconnection structure employs a metal core layer having formed thereupon a solder interconnection layer which bridges to a pair of bond pads formed within the pair of microelectronic substrates, where the solder interconnection layer which bridges to the pair of bond pads formed within the pair of microelectronic substrates is formed with an hourglass shape.

Desirable in the art of microelectronic fabrication are additional methods and materials which may be employed for forming within the art of microelectronic fabrication solder interconnection structures for directly interconnecting a pair of microelectronic substrates within a microelectronic fabrication, where upon thermal reflow to form a reflowed solder interconnection structure, the reflowed solder interconnection structure is formed with attenuated thermally induced physically stress and strain with respect to the pair of microelectronic substrates.

It is towards the foregoing object that the present invention is directed.

SUMMARY OF THE INVENTION

A first object of the present invention is to provide a method for forming for use within a microelectronic fabrication a solder interconnection structure for directly interconnecting a pair of microelectronic substrates within the microelectronic fabrication.

A second object of the present invention is to provide a method in accord with the first object of the present invention, wherein the solder interconnection structure is formed such that upon reflow to form a reflowed solder interconnection structure directly interconnecting the pair of microelectronic substrates within the microelectronic fabrication, the reflowed solder interconnection structure is formed with attenuated physical stress and strain with respect to the pair of microelectronic substrates.

A third object of the present invention is to provide a method in accord with the first object of the present invention or the second object of the present invention, which method is readily commercially implemented.

In accord with the objects of the present invention, there is provided by the present invention a method for forming a solder interconnection structure. To practice the method of the present invention, there is first provided a substrate having formed thereover a bond pad. There is then formed upon the bond pad a first solder interconnection layer. There is then formed over the first solder interconnection layer an annular solder non-wettable copper oxide layer which does not cover an upper dome portion of the first solder interconnection layer. Finally, there is then formed over the upper dome portion of the first solder interconnection layer and not upon the annular solder non-wettable copper oxide layer a second solder interconnection layer.

The present invention also contemplates a solder interconnection structure formed in accord with the method of the present invention.

There is provided by the present invention a method for forming for use within a microelectronic fabrication a solder interconnection structure, wherein the solder interconnection structure is formed such that upon reflow to form a reflowed solder interconnection structure directly interconnecting a pair of microelectronic substrates within the microelectronic fabrication the reflowed solder interconnection structure is formed with attenuated physical stress and strain with respect to the pair of microelectronic substrates. The method of the present invention realizes the foregoing object by employing when forming the solder interconnection structure a first solder interconnection layer having formed annularly thereover and not covering an upper dome portion of the first solder interconnection layer an annular solder non-wettable copper oxide layer, such that when forming within the solder interconnection structure a second solder interconnection layer over the first solder interconnection layer, the second solder interconnection layer is constrained over the upper dome area of the first solder interconnection layer due to non-wetting with the annular solder non-wetting copper oxide layer. The present invention thus provides a solder interconnection structure of enhanced height in comparison with a conventional solder interconnection structure, wherein the enhanced height of the solder interconnection structure provides upon reflow a reflowed solder interconnection structure with attenuated physical stress and strain with respect to a pair of microelectronic substrates which are directly interconnected while employing the reflowed solder interconnection structure of the present invention.

The method of the present invention is readily commercially implemented. The present invention employs methods as are either generally known in the art of microelectronic fabrication, or readily adapted to the art of microelectronic fabrication. Since it is a process control and materials selection which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a method for forming for use within a microelectronic fabrication a solder interconnection structure, wherein the solder interconnection structure is formed such that upon reflow to form a reflowed solder interconnection structure directly interconnecting a pair of microelectronic substrates within the microelectronic fabrication, the reflowed solder interconnection structure is formed with attenuated physical stress and strain with respect to the pair of microelectronic substrates. The method of the present invention realizes the foregoing object by employing when forming the solder interconnection structure a first solder interconnection layer having formed annularly thereover but not covering an upper dome portion of the first solder interconnection layer an annular solder non-wettable copper oxide layer, such that when forming within the solder interconnection structure a second solder interconnection layer over the first solder interconnection layer, the second solder interconnection layer is constrained over the upper dome area of the first solder interconnection layer due to non-wetting with the annular solder non-wetting copper oxide layer.

The method of the present invention also contemplates a solder interconnection structure formed in accord with the method of the present invention.

The solder interconnection structure of the present invention may be employed for forming solder interconnections directly between various types of microelectronic substrates employed within various types of microelectronic fabrications. The solder interconnection structure of the present invention may be employed for forming solder interconnections directly between microelectronic substrates including but not limited to silicon microelectronic substrates, ceramic microelectronic substrates and composite microelectronic substrates (such as but not limited to glass-ceramic composite microelectronic substrates and filled organic polymer composite microelectronic substrates), as employed within microelectronic fabrications including but not limited to integrated circuit microelectronic fabrications, hybrid circuit microelectronic fabrications, ceramic substrate microelectronic fabrications, solar cell optoelectric microelectronic fabrications, display image array optoelectronic microelectronic fabrications and sensor image array optoelectronic microelectronic fabrications.

Figure 1:
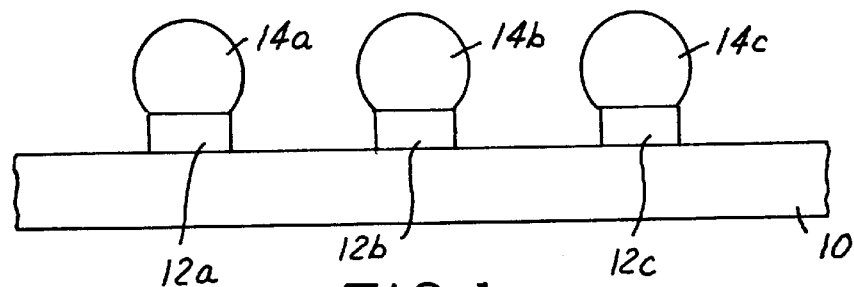
FIG. 1, FIG. 2, FIG. 3, FIG. 4, FIG. 5, FIG. 6 and FIG. 7 show a series of schematic cross-sectional diagrams illustrating the results of forming, in accord with a preferred embodiment of the present invention, a reflowed solder interconnection structure interconnecting a pair of microelectronic substrates within a microelectronic fabrication in accord with the present invention.

Referring now to FIG. 1 to FIG. 7, there is shown a series of schematic cross-sectional diagrams illustrating the results of progressive stages in forming in accord with a preferred embodiment of the present invention a reflowed solder interconnection structure interconnecting a pair of microelectronic substrates in accord with the present invention. Shown in FIG. 1 is a schematic cross-sectional diagram of the microelectronic fabrication at an early stage in its fabrication in accord with the preferred embodiment of the present invention.

Shown in FIG. 1 is a first substrate 10 having formed thereover a series of first bond pads 12a, 12b and 12c, each in turn having formed thereupon a corresponding first solder interconnection layer 14a, 14b or 14c which in the aggregate comprise a series of first solder interconnection layers 14a, 14b and 14c.

Within the preferred embodiment of the present invention, each of the first substrate 10, the series of first bond pad layers 12a, 12b and 12c and the corresponding series of first solder interconnection layers 14a, 14b and 14c may be formed employing methods and materials as are conventional in the art of microelectronic fabrication.

In that regard, within the preferred embodiment of the present invention with respect to the first substrate 10, the first substrate 10 may be selected from the group of substrates including but not limited to silicon substrates, ceramic substrates and composite substrates of the types as described above, which, as noted above, may be employed within microelectronic fabrications including but not limited to integrated circuit microelectronic fabrications, hybrid circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may comprise a substrate alone as employed within the microelectronic fabrication, or in the preferred alternative, the substrate 10 may comprise the substrate as employed within the microelectronic fabrication, where the substrate has formed thereupon and/or thereover any of several additional microelectronic layers as are conventionally employed within the microelectronic fabrication within which is employed the substrate. Such additional microelectronic layers may be formed from microelectronic materials including but not limited to microelectronic conductor materials, microelectronic semiconductor materials and microelectronic dielectric materials.

Similarly, although also not specifically illustrated within the schematic cross-sectional diagram of FIG. 1, the substrate 10, typically but not exclusively when the substrate 10 comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to resistors, transistors, diodes and capacitors.

Within the preferred embodiment of the present invention with respect to the series of first bond pads 12a, 12b and 12c, the series of first bond pads 12a, 12b and 12c may be formed from any of several bond pad materials as are conventional in the art of microelectronic fabrication, such bond pad materials including but not limited to aluminum, aluminum alloy, copper and copper alloy bond pad materials. Typically and preferably each of the first bond pads 12a, 12b and 12c is formed of a bidirectional line width of from about 50 to about 150 microns and a pitch spacing of from about 150 to about 300 microns, as well as a thickness of from about 4,000 to about 15,000 angstroms. Although not specifically illustrated within the schematic cross-sectional diagram of FIG. 1, each of the first bond pads 12a, 12b and 12c may also have: (1) formed aligned thereupon additional bonding enhancement layers and anti-corrosion layers, such as but not limited to nickel layers, gold layers, chromium layers and silver layers, as are conventional in the art of microelectronic fabrication, as well as; (2) dielectric passivation layers encapsulating the peripheries of each of the first bond pads 12a, 12b and 12c.

Finally, within the preferred embodiment of the present invention with respect to the series of first solder interconnection layers 14a, 14b and 14c each of the first solder interconnection layers 14a, 14b and 14b may be formed of solder interconnection materials as are conventional in the art of microelectronic fabrication, such solder interconnection materials being selected from the group of solder interconnection materials including but not limited to lead solder interconnection materials, lead-tin alloy solder interconnection materials, lead-antimony alloy solder interconnection materials, lead-indium alloy solder interconnection materials and higher order alloys incorporating lead-tin alloy solder interconnection materials, lead-antimony alloy solder interconnection materials and lead-indium alloy solder interconnection materials. For the preferred embodiment of the present invention, the first solder interconnection layers 14a, 14b and 14c are each formed of a comparatively higher melting lead-tin alloy solder interconnection material, having a lead content of from about 90 to about 97 weight percent and a tin content of from about 3 to about 10 weight percent, as is otherwise generally conventional in the art of microelectronic fabrication.

The series of first solder interconnection layers 14a, 14b and 14c may be formed employing methods as are conventional in the art of microelectronic fabrication, including but not limited to plating methods, screening methods and solder pre-form attachment methods. Similarly, as is illustrated within the schematic cross-sectional diagram of FIG. 1, the series of first solder interconnection layers 14a, 14b and 14c is preferably reflowed to provide each of the first solder interconnection layers 14a, 14b and 14c of a truncated spherical shape which simultaneously provides effective connection of each of the first solder interconnection layers 14a, 14b and 14c to the corresponding series of bond pads 12a, 12b and 12c, although such reflow is not necessarily essential within all embodiments of the present invention. Under circumstances within the preferred embodiment of the present invention where the series of first solder interconnection layers 14a, 14b and 14c is formed of the higher melting point lead-tin alloy solder, as disclosed above, of from about 90 to about 97 weight percent lead and from about 3 to about 10 weight percent tin, a typical and preferably first solder interconnection layer 14a, 14b and 14c reflow temperature is from about 280 to about 360 degrees centigrade. Typically and preferably, each first solder interconnection layer 14a, 14b or 14c within the series of first solder interconnection layers 14a, 14b and 14c is formed to a maximum thickness of from about 50 to about 150 microns with the truncated spherical shape as illustrated within the schematic cross-sectional diagram of FIG. 1.

Figure 2:
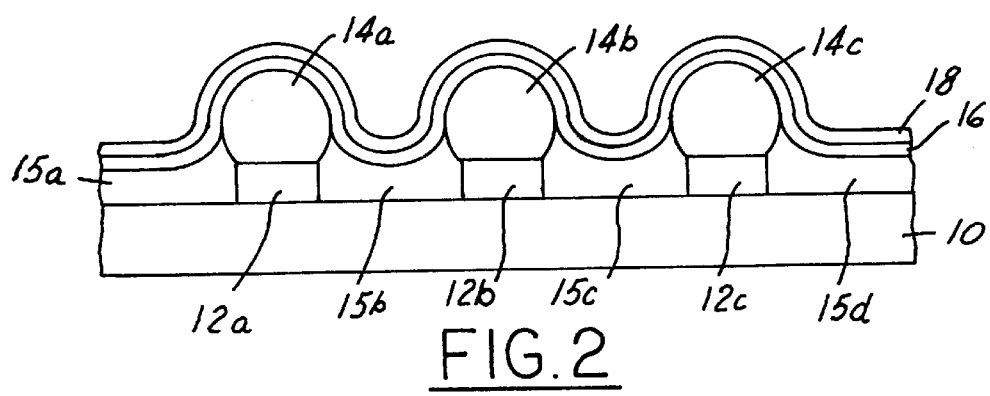

Referring now to FIG. 2, there is shown a schematic cross-sectional diagram illustrating the results of further processing of the microelectronic fabrication whose schematic cross-sectional diagram is illustrated in FIG. 1.

Shown in FIG. 2, is a schematic cross-sectional diagram of a microelectronic fabrication otherwise equivalent to the microelectronic fabrication whose schematic cross-sectional diagram is illustrated in FIG. 1, but wherein, in a first instance, there is formed interposed between the series of first bond pads 12a, 12b and 12c having formed thereupon the series of first solder interconnection layers 14a, 14b and 14c, and partially encapsulating the series of first solder interconnection layers 14a, 14b and 14c, a series of photoresist lift off layers 15a, 15b, 15c and 15d.

The series of photoresist lift off layers 15a, 15b, 15c and 15d may be formed employing methods and materials as are conventional in the art of microelectronic fabrication, including photoresist deposition, exposure and development methods as are conventional in the art of microelectronic fabrication, in conjunction with photoresist materials selected from the general groups of photoresist materials including but not limited to positive photoresist materials and negative photoresist materials. Typically and preferably, the series of photoresist lift off layers 15a, 15b, 15c and 15d is formed to a thickness sufficient to encapsulate the bottom of each first solder interconnection layer 14a, 14b or 14c within the series of first solder interconnection layers 14a, 14b and 14c. Typically and preferably, this will provide each of the patterned photoresist lift off layers 15a, 15b, 15c and 15d of a median thickness in a range of from about 2 to about 15 microns.

Shown also within FIG. 2 formed upon exposed portions of the series of photoresist lift off layers 15a, 15b, 15c and 15d and upon exposed portions of the series of first solder interconnection layers 14a, 14b and 14c is a blanket barrier layer 16, wherein the blanket barrier layer 16 in turn has formed thereupon a blanket copper layer 18.

Within the preferred embodiment of the present invention with respect to the blanket barrier layer 16, the blanket barrier layer 16, although in general optional within the present invention is nonetheless desirable under circumstances where it is desirable to limit interdiffusion of the solder interconnection material from which is formed the series of first solder interconnection layers 14a, 14b and 14c with adjoining layers, such as the blanket copper layer 18 within the microelectronic fabrication whose schematic cross-sectional diagram is illustrated in FIG. 2. Thus, within the preferred embodiment of the present invention, the blanket barrier layer 16 is formed of a barrier material which is both conductive and not susceptible to interdiffusion with the higher melting point lead-tin solder material from which is formed the series of first solder interconnection layers 14a, 14b and 14c. Although, as disclosed within Agarawala et al, as cited within the Description of the Related Art (the disclosure of all of which related art is incorporated herein fully by reference) any of several barrier materials may be employed to effect the foregoing desired result, for the preferred embodiment of the present invention, the barrier material is preferably a chromnium barrier material. Typically and preferably, the blanket barrier layer 16 is formed to a thickness of from about 200 to about 800 angstroms.

Finally, within the preferred embodiment of the present invention with respect to the blanket copper layer 18, typically and preferably, the blanket copper layer 18 is formed of copper formed to a thickness of from about 2,000 to about 10,000 angstroms upon the blanket barrier layer 16.

Within the preferred embodiment of the present invention, both the blanket barrier layer 16 and the blanket copper layer 18 may be formed employing methods as are conventional in the art of microelectronic fabrication, including but not limited to thermally assisted evaporation methods, electron beam assisted evaporation methods and physical vapor deposition (PVD) sputtering methods.

Figure 3:
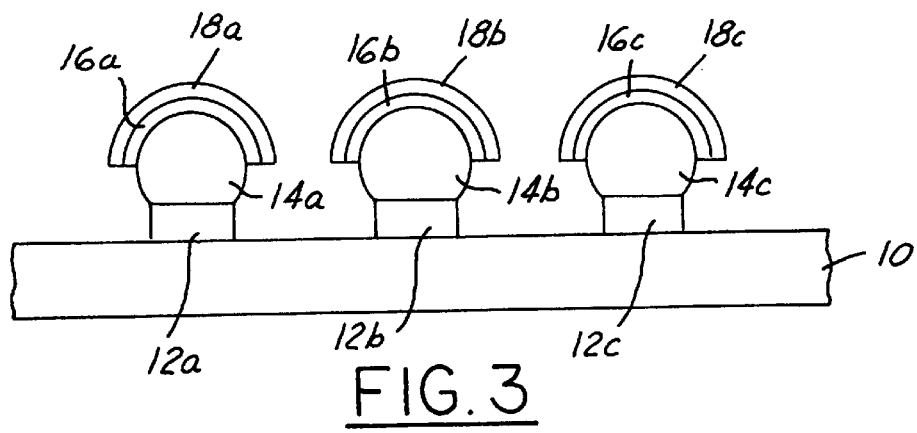

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the patterned photoresist lift off layers 15a, 15b, 15c and 15d have been dissolved, taking with them corresponding overlying portions of the blanket barrier layer 16 and the blanket copper layer 18, and thus leaving remaining a series of patterned barrier layers 16a, 16b and 16c having formed aligned thereupon a series of patterned copper layers 18a, 18b and 18c both of which are formed covering an upper portion of each of the corresponding first solder interconnection layers 14a, 14b and 14c.

Within the preferred embodiment of the present invention, to form the microelectronic fabrication whose schematic cross-sectional diagram is illustrated in FIG. 3 from the microelectronic fabrication whose schematic cross-sectional diagram is illustrated in FIG. 2 there may be employed a photoresist stripper solution conventional in the art of microelectronic fabrication as is employed for stripping the photoresist material from which is formed the photoresist lift off layers 15a, 15b, 15c and 15d, provided that the photoresist stripper solution does not corrode, erode, delaminate or otherwise degrade the series of patterned barrier layers 16a, 16b and 16c, the series of patterned copper layers 18a, 18b and 18c and remaining structures within the microelectronic fabrication whose schematic cross-sectional diagram is illustrated in FIG. 3.

Figure 4:
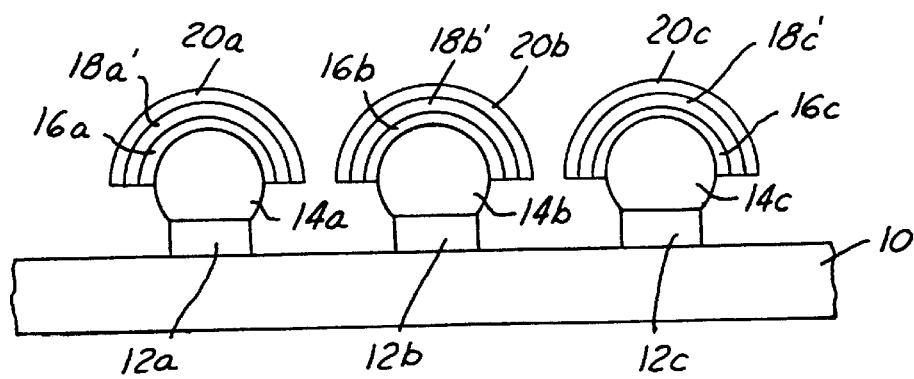

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein each of the patterned copper layers 18a, 18b and 18c has been partially oxidized to form a corresponding depleted patterned copper layer 18a', 18b' or 18c', while simultaneously forming a corresponding patterned copper oxide layer 20a, 20b or 20c adherent thereto.

Within the preferred embodiment of the present invention, the series of patterned copper layers 18a, 18b and 18c may be partially oxidized to form the series of depleted patterned copper layers 18a', 18b' and 18c' and the corresponding series of patterned copper oxide layers 20a, 20b and 20c adherent thereto while employing methods as are conventional in the art of microelectronic fabrication, while similarly also assuring that neither the patterned barrier layers 16a, 16b and 16c nor any of the remaining structures within the microelectronic fabrication whose schematic cross-sectional diagram is illustrated within FIG. 4 are corroded, eroded, delaminated or otherwise degraded. Thus, while any of several oxidation methods may be employed for forming from the series of patterned copper layers 18a, 18b and 18c the series of depleted patterned copper layers 18a', 18b' and 18c' having the corresponding series of patterned copper oxide layers 20a, 20b and 20c adherent thereto, including but not limited to wet chemical oxidation methods, thermal oxidation methods and oxygen containing plasma oxidation methods, for the preferred embodiment of the present invention, the patterned copper layers 18a, 18b and 18c are oxidized to form the series of depleted patterned copper layers 18a', 18b' and 18c' and the corresponding series of patterned copper oxide layers 20a, 20b and 20c adherent thereto while employing a wet chemical oxidation method employing a mixture of sodium chlorate and sodium hydroxide blend at: (1) a temperature of form about 150° F. to about 170° F.; (2) an immersion treatment time of from about 2.9 to about 3.1 minutes; and (3) a sodium chlorate and sodium hydroxide concentration within a surfactant additive solution of from about 18 to about 22 weight percent.

Typically and preferably, within the preferred embodiment of the present invention, the series of patterned copper layers 18a, 18b and 18c is partially and selectively oxidized to form the series of depleted patterned copper layers 18a', 18b' and 18c', while the series of patterned copper oxide layers 20a, 20b and 20c formed adherent thereto are each formed to an increase of weight from 0.18 mg/cm$^2$ to 0.5 mg/c because of the oxidation process.

Figure 5:
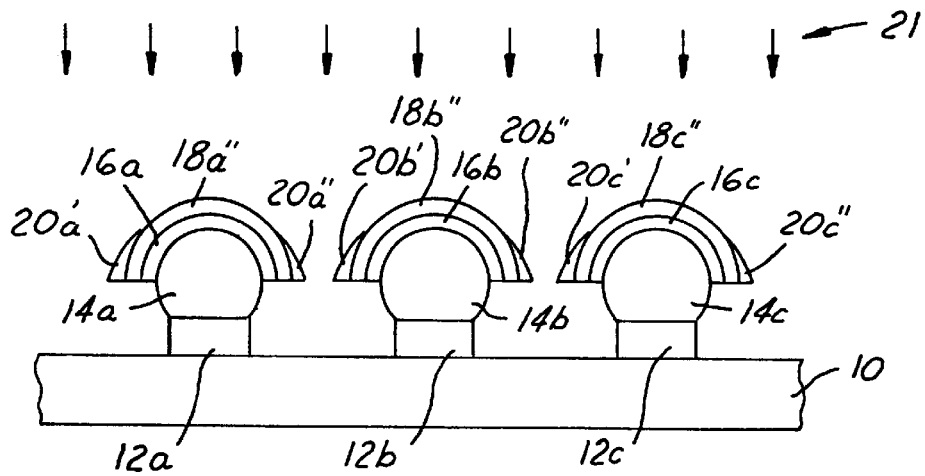

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein each of the patterned copper oxide layers 20a, 20b and 20c has been anisotropically etched within an anisotropic etchant 21 to form therefrom a corresponding series of etched patterned copper oxide layers 20a', 20a", 20b', 20b", 20c' and 20c" formed in an annular position over each of the corresponding first solder interconnection layers 14a, 14b and 14c, and leaving exposed a corresponding etched depleted patterned copper layer 18a", 18b" or 18c". Within the preferred embodiment of the present invention, the etched patterned copper oxide layers 20a', 20a", 20b', 20b", 20c' and 20c" are etched such that they do not cover an upper dome portion of each of the first solder interconnection layers 14a, 14b and 14c. Similarly, each of the etched patterned copper oxide layers 20a', 20a", 20b', 20b", 20c' and 20c" is formed with a maximum thickness at its outermost edge of from about 50 to about 200 angstroms. Yet similarly, it is desirable within the present invention to not completely anisotropically etch through the series of depleted patterned copper layers 18a', 18b' and 18c' when forming the series of etched depleted patterned copper layers 18a", 18b" and 18c", since in so doing there may be exposed the series of patterned barrier layers 16a, 16b and 16c which will not necessarily be readily wettable with a series of second solder interconnection layers subsequently formed within the microelectronic fabrication whose schematic cross-sectional diagram is illustrated in FIG. 5.

Typically and preferably, although not exclusively, the anisotropic etchant 21 employs an inert sputtering ion anisotropic etchant, although other anisotropic etchants, such as but not limited to reactive ion anisotropic etchants, may also be employed when forming from series of patterned copper oxide layers 20a, 20b and 20b within the microelectronic fabrication whose schematic cross-sectional diagram is illustrated in FIG. 4 the series of etched patterned copper oxide layers 20a', 20a", 20b', 20b", 20c' and 20c" within the microelectronic fabrication whose schematic cross-sectional diagram is illustrated in FIG. 5. Typically and preferably the inert sputtering ion anisotropic etchant employs an argon inert sputtering ion, although other inert sputtering ions, such as but not limited to xenon and krypton inert sputtering ions, may also be employed.

Typically and preferably an anisotropic sputtering method which employs the anisotropic etchant 21 also employs: (1) a reactor chamber pressure of from about 0.001 to about 0.015 torr; (2) a source radio frequency power of from about 50 to about 1,000 watts at a source radio frequency of 13.56 MHZ; (3) a substrate 10 temperature of from about 20 to about 75 degrees centigrade; and (4) an argon flow rate of from about 2 to about 50 standard cubic centimeters per minute (sccm).

Figure 6:
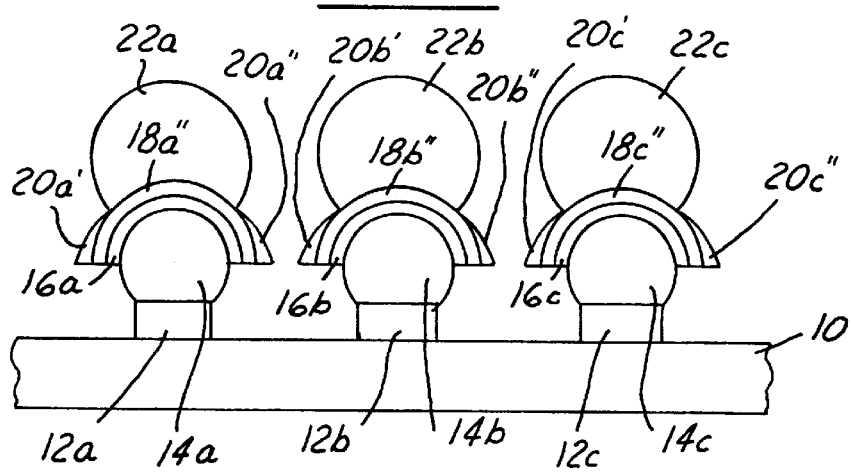

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein there is formed upon each of the etched depleted patterned copper layers 18a", 18b" and 18c" a corresponding second solder interconnection layer 22a, 22b or 22c, where the corresponding second solder interconnection layers 22a, 22b and 22c are constrained by the series of etched patterned copper oxide layers 20a', 20a", 20b', 20b", 20c' and 20c" since the solder interconnection material from which is formed the series of second solder interconnection layers 22a, 22b and 22c wets the surface of the etched depleted patterned copper layers 18a", 18b" and 18c", but does not substantially wet the surfaces of the etched patterned copper oxide layers 20a', 20a", 20b', 20b", 20c' and 20c".

Within the context of the present invention, it is intended that by "wetting" the surface of the etched depleted patterned copper layers 18a", 18b" and 18c" the series of second solder interconnection layers 22a, 22b and 22c has a contact angle of less than about 15 degrees therewith, more preferably from about 5 to about 30. Similarly, within the context of the present invention, it is intended that by "not substantially wetting" the series of etched patterned copper oxide layers 20a', 20a", 20b', 20b", 20c' and 20c" the series of second solder interconnection layers 22a, 22b and 22c has a contact angle of greater than about 90 degrees therewith, more preferably from about 70 to about 120. All contact angles are intended to be measured for the series of second solder interconnection layers 22a, 22b and 22c in a reflowed molten state.

Within the preferred embodiment of the present invention, the series of second solder interconnection layers 22a, 22b and 22c may be formed employing methods and materials generally analogous to the methods and materials employed for forming the series of first solder interconnection layers 14a, 14b and 14c. Preferably, although not exclusively, the series of second solder interconnection layers 22a, 22b and 22c is formed of a lower melting point lead-tin alloy solder material in comparison with the higher melting point lead-tin alloy solder material from which is formed the series of first solder interconnection layers 14a, 14b and 14c. Typically and preferably, the lower melting point lead-tin alloy solder material has a lead content of from about 34 to about 40 weight percent and a tin content of from about 60 to about 66 weight percent, thus providing a reflow temperature of from about 200 to about 230 degrees centigrade. Finally, each of the second solder interconnection layers 22a, 22b and 22c is formed to a thickness of from about 50 to about 125 microns.

Figure 7:
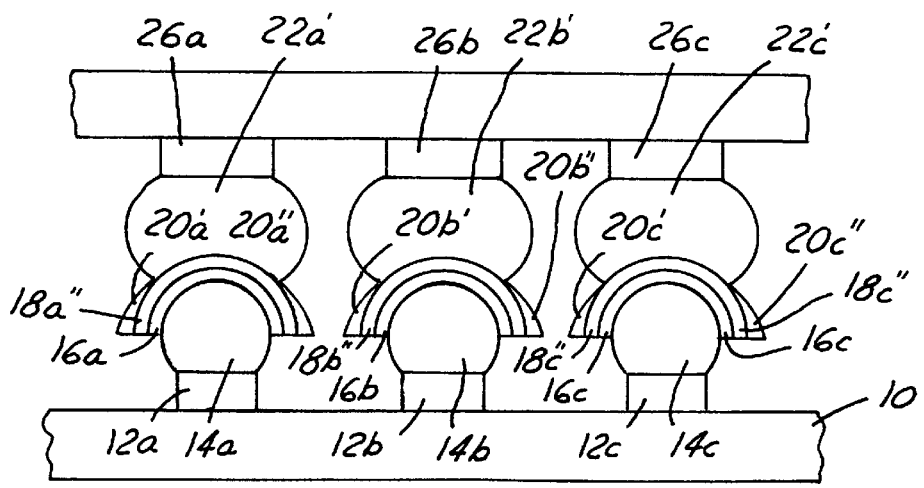

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein there has been positioned contacting the series of second solder interconnection layers 22a, 22b and 22c a second substrate 24 having formed thereupon a series of second bond pads 26a, 26b and 26c, and wherein upon thermal annealing and reflow, the second solder interconnection layers 22a, 22b and 22c collapse to form a corresponding series of collapsed second solder interconnection layers 22a', 22b' and 22c', which in addition to being wetted to the series of etched depleted patterned copper layers 18a", 18b" and 18c" are also wetted to the series of second bond pads 26a, 26b and 26c.

Within the preferred embodiment of the present invention the series of second bond pads 26a, 26b and 26c may be formed employing methods, materials and dimensions analogous or equivalent to the methods, materials and dimensions employed for forming the series of first bond pads 12a, 12b and 12c. Similarly, within the preferred embodiment of the present invention, the second substrate 24 may be selected from the group of substrates analogous to the group of substrates from which the first substrate 10 may be selected. Within the preferred embodiment of the present invention, typically and preferably, the first substrate 10 is a semiconductor substrate and the second substrate 24 is an organic substrate.

Upon forming the microelectronic fabrication whose schematic cross-sectional diagram is illustrated in FIG. 7, there is formed a microelectronic fabrication having formed therein a series of three reflowed solder interconnection structures bridging from the series of first bond pads 12a, 12b and 12c to the corresponding series of second bond pads 26a, 26b and 26c. Within the present invention, the series of reflowed solder interconnection structures provides for attenuated physical stress and strain within the series of reflowed solder interconnection structures with respect to the pair of substrates comprising the first substrate 10 and the second substrate 24 since the series of reflowed solder interconnection structures is formed with a series of annular copper oxide layers which attenuates wetting of a reflowed second solder interconnection layer within a reflowed solder interconnection structure with respect to a reflowed first solder interconnection layer within the reflowed solder interconnection structure.

Similarly, as is understood by a person skilled in the art, although the preferred embodiment of the present invention illustrates the present invention within the context of a bi-layer solder interconnection layer solder interconnection structure, the present invention also encompasses higher order multi-layer solder interconnection layer solder interconnection structures which may be formed incident to multiple successive practice of the present invention with respect to solder interconnection layers when forming a multilayer solder interconnection layer solder interconnection structure.

As is similarly understood by a person skilled in the art, the preferred embodiment of the present invention is illustrative of the present invention rather than limiting of the present invention. Revisions and modifications may be made to methods, materials, structures and dimensions through which is provided the preferred embodiment of the present invention, while still providing embodiments which are within the spirit and scope of the present invention, in accord with the accompanying claims.

What is claimed is:

1. A method for forming a solder interconnection structure comprising:

providing a substrate having formed thereover a bond pad;

forming upon the bond pad a first solder interconnection layer;

forming over the first solder interconnection layer an annular solder non-wettable copper oxide layer which does not cover an upper dome portion of the first solder interconnection layer;

forming over the upper dome portion of the first solder interconnection layer and not upon the annular solder non-wettable copper oxide layer a second solder interconnection layer.

2. The method of claim 1 wherein the substrate is employed within a microelectronic fabrication selected from the group consisting of integrated circuit microelectronic fabrications, organic substrate microelectronic fabrications, hybrid circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the first solder interconnection layer is formed of a first solder material having a higher melting point than a second solder material employed for forming the second solder interconnection layer.

4. The method of claim 1 wherein the first solder interconnection layer is reflowed prior to forming thereover the annular solder non-wettable copper oxide layer.

5. The method of claim 1 wherein the annular solder non-wettable copper oxide layer is formed by anisotropic etching of a copper oxide layer formed in-situ from a copper layer formed over the first solder interconnection layer.

6. The method of claim 1 wherein:
   the first solder interconnection layer is formed to a thickness of from about 50 to about 150 microns;
   the second solder interconnection layer is formed to a thickness of from about 50 to about 125 microns; and
   the annular solder non-wettable copper oxide layer is formed to a thickness of from about 50 to about 200 angstroms.

7. A method for forming a solder interconnection structure comprising:
   providing a substrate having formed thereover a bond pad;
   forming upon the bond pad a first solder interconnection layer;
   forming over the first solder interconnection layer a copper layer;
   oxidizing the copper layer at least partially to form a copper oxide layer;
   etching anisotropically, while employing an anisotropic etch method, the copper oxide layer to form an annular solder non-wettable copper oxide layer which does not cover an upper dome portion of the first solder interconnection layer;
   forming over the upper dome portion of the first solder interconnection layer and not upon the annular solder non-wettable copper oxide layer a second solder interconnection layer.

8. The method of claim 7 wherein the substrate is employed within a microelectronic fabrication selected from the group consisting of integrated circuit microelectronic fabrications, organic substrate microelectronic fabrications, hybrid circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

9. The method of claim 7 wherein the first solder interconnection layer is formed of a first solder material having a higher melting point than a second solder material employed for forming the second solder interconnection layer.

10. The method of claim 7 wherein the first solder interconnection layer is reflowed prior to forming thereover the annular solder non-wetting copper oxide layer.

11. The method of claim 7 wherein the anisotropic etch method employs an inert sputtering ion.

12. The method of claim 7 wherein:
   the first solder interconnection layer is formed to a thickness of from about 50 to about 150 microns;
   the second solder interconnection layer is formed to a thickness of from about 50 to about 125 microns; and
   the annular solder non-wetting copper oxide layer is formed to a thickness of from about 50 to about 200 angstroms.

\* \* \* \* \*